(12) United States Patent
Wilcox et al.

(10) Patent No.: US 6,970,010 B2
(45) Date of Patent: *Nov. 29, 2005

(54) APPARATUS AND METHOD FOR POWER EFFICIENT LINE DRIVER

(75) Inventors: Jeffrey R. Wilcox, Hudson, OH (US); Noam Yosef, Haifa (IL); Marcelo Yuffe, Binyamina (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/643,802

(22) Filed: Aug. 18, 2003

(65) Prior Publication Data

US 2004/0051555 A1 Mar. 18, 2004

Related U.S. Application Data

(63) Continuation of application No. 09/968,259, filed on Sep. 28, 2001, now Pat. No. 6,633,178.

(51) Int. Cl.[7] .......................................... H03K 19/0175
(52) U.S. Cl. ............................ 326/30; 326/86; 326/21; 326/83; 326/90; 327/108
(58) Field of Search ............................... 326/30, 21, 86, 326/83, 90, 56–58; 327/108–112; 710/100, 710/126

(56) References Cited

U.S. PATENT DOCUMENTS

| | | | |
|---|---|---|---|
| 4,584,492 A | 4/1986 | Sharp | |
| 4,857,779 A | 8/1989 | Harlos et al. | |
| 4,975,598 A | 12/1990 | Borkar | |
| 5,438,278 A | * 8/1995 | Wong et al. | 326/27 |
| 5,528,166 A | 6/1996 | Iikbahar | |
| 5,546,016 A | 8/1996 | Allen | |
| 5,760,657 A | 6/1998 | Johnson | |
| 5,896,983 A | 4/1999 | Wood | |
| 5,898,321 A | 4/1999 | Ilkbahar et al. | |
| 5,926,049 A | 7/1999 | Shi | |
| 6,025,792 A | 2/2000 | Smith | |
| 6,031,385 A | 2/2000 | Ilkbahar | |
| 6,072,342 A | 6/2000 | Haider et al. | |
| 6,075,379 A | 6/2000 | Haider et al. | |
| 6,084,426 A | 7/2000 | Allen | |
| 6,127,840 A | 10/2000 | Coteus et al. | |
| 6,144,218 A | 11/2000 | Smith et al. | |
| 6,150,862 A | 11/2000 | Vikinski | |
| 6,166,563 A | 12/2000 | Volk et al. | |

(Continued)

FOREIGN PATENT DOCUMENTS

DE 199 42 688 A1 3/2001

*Primary Examiner*—Vibol Tan
(74) *Attorney, Agent, or Firm*—Blakely, Sokoloff, Taylor & Zafman LLP (57) ABSTRACT

A method is described that involves driving a first current through a line and a termination resistance so that a logical value on the line changes from a first logical value to a second logical value. The method also includes holding the second logical value on the line by driving a second current through the line and the termination resistance where the second current less than the first current. An apparatus is described that includes a driver that drives a first current through a line and a termination resistance so that a logical value on the line changes from a first logical value to a second logical value. The driver holds the second logical value on the line by driving a second current through the line and the termination resistance. The second current is less than said first current.

25 Claims, 8 Drawing Sheets

U.S. PATENT DOCUMENTS

| | | |
|---|---|---|
| 6,172,546 B1 | 1/2001 | Liu et al. |
| 6,175,928 B1 | 1/2001 | Liu et al. |
| 6,184,737 B1 | 2/2001 | Taguchi |
| 6,198,307 B1 * | 3/2001 | Garlepp et al. ............... 326/83 |
| 6,265,893 B1 | 7/2001 | Bates |
| 6,288,563 B1 | 9/2001 | Muljono et al. |
| 6,289,447 B1 | 9/2001 | Ilkbahar |
| 6,298,450 B1 | 10/2001 | Liu et al. |
| 6,300,798 B1 | 10/2001 | Possley |
| 6,317,369 B1 * | 11/2001 | Kubo et al. ................. 365/193 |
| 6,323,647 B1 | 11/2001 | Shrivastava et al. |
| 6,347,850 B1 | 2/2002 | Volk |
| 6,351,136 B1 | 2/2002 | Jones et al. |
| 6,366,129 B1 | 4/2002 | Douglas, III et al. |
| 6,366,867 B2 | 4/2002 | Sine et al. |
| 6,378,010 B1 | 4/2002 | Burks |
| 6,380,758 B1 | 4/2002 | Hsu et al. |
| 6,396,305 B1 | 5/2002 | Carlson |
| 6,445,316 B1 | 9/2002 | Hsu et al. |
| 6,456,016 B1 | 9/2002 | Sundahl et al. |
| 6,459,737 B1 | 10/2002 | Jang |
| 6,480,438 B1 | 11/2002 | Park |
| 6,483,354 B1 * | 11/2002 | Gasparik .................... 327/112 |
| 6,493,394 B2 * | 12/2002 | Tamura et al. .............. 375/257 |
| 6,509,780 B1 | 1/2003 | Lim et al. |
| 6,525,683 B1 | 2/2003 | Gu |
| 6,693,450 B1 * | 2/2004 | Volk et al. .................... 326/30 |

* cited by examiner

APPARATUS AND METHOD FOR POWER EFFICIENT LINE DRIVER

The present patent application is a Continuation of application Ser. No. 09/968,259, filed Sep. 28, 2001 now U.S. Pat. No. 6,633,178.

FIELD OF THE INVENTION

The field of invention relates to electrical circuitry in general; and, more specifically, to an apparatus and method for a power efficient line driver.

BACKGROUND

Figure 1A:
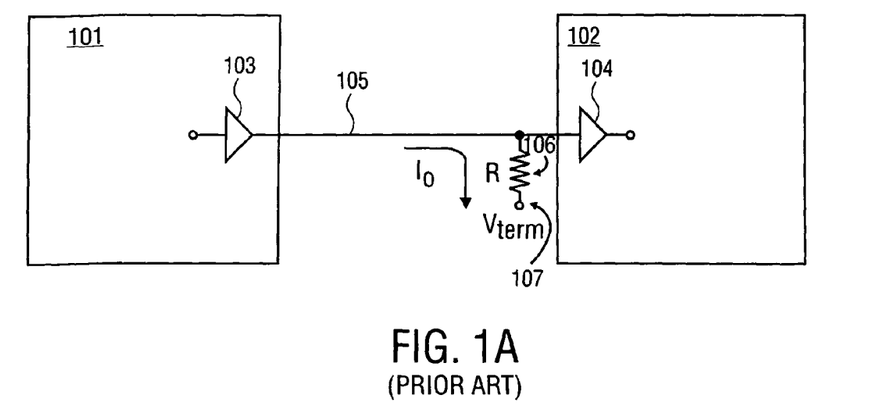
FIG. 1a shows a resistive termination load technique.

FIG. 1a shows a driver 103 that is responsible for driving information, over communication line 105, to receiver 104. Communication line 105 (which may also be referred to as line 105 for simplicity) is a conductive strip that propagates the information being sent by driver 103 to receiver 104. Depending on the implementation, communication line 105 may correspond to the wiring that exists between a pair of semiconductor chips (e.g., circuitry 101 corresponds to a first semiconductor chip and circuitry 102 corresponds to a second semiconductor chip) or between different regions of the same semiconductor chip (e.g., circuitry 101 corresponds to a first region and circuitry 102 corresponds to a second region where regions 101 and 102 are on the same semiconductor chip).

As semiconductor manufacturing techniques continue to advance, the speed of operation of semiconductor chips continues to increase. As such, the frequencies involved with the driver's 103 signaling of information to receiver 104 are continue to rise as circuitry 101, circuitry 102 and line 105 are implemented with more sophisticated semiconductor manufacturing technology. Complications arise as signaling frequencies increase, however.

Figure 1B:
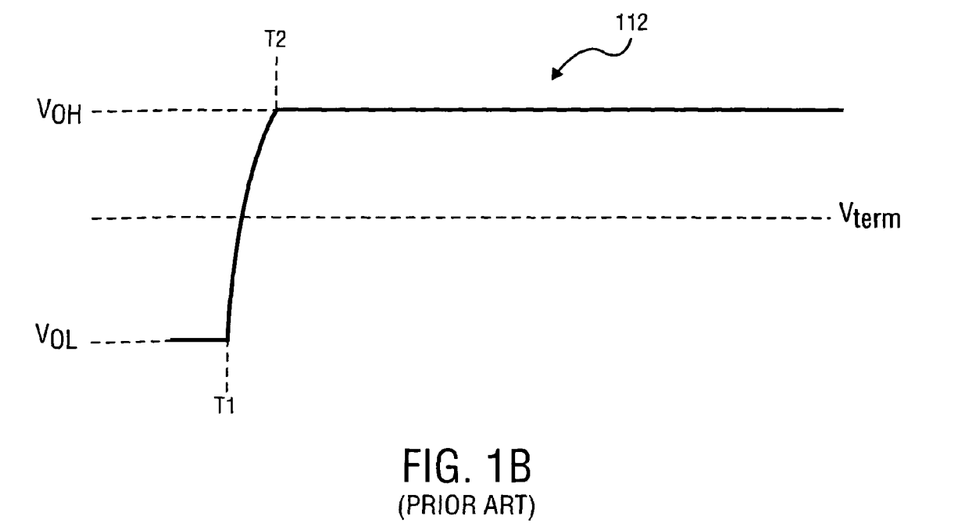

Specifically, as signaling frequency increases, the likelihood increases that imperfections in the shape of the signaling waveform driven onto line 105 by driver 103 (e.g., as caused by back and forth "reflections" of the waveform between the receiver 104 and driver 103) will disturb the reliable reception of data at the receiver 104. An exemplary ideal signaling waveform 112 (i.e., without imperfections) that shows the transition from a logical low to a logical high between times T1 and T2 is shown in FIG. 1b Part of the design challenge in designing circuitry 101, circuitry 102 and line 105, therefore, is reducing the aforementioned likelihood. One technique is to "terminate" line 105 with a termination load 106. Termination load 106 is typically designed to have a resistance R that is proximate to the characteristic impedance of line 105. As R approaches the characteristic impedance of line 105, the strength of the reflections between receiver 104 and driver 103 are reduced which, in turn, corresponds to less disturbance in the shape of the signaling waveform 112.

A problem with traditional resistive termination load techniques (such as that described above), however, is the power dissipation that results. Specifically, when a current flows through a resistor, power is dissipated by the resistor according to the relationship $P = I^2 R = V^2/R$ (where I is the current that flows through the resistor, R is the resistance of the resistor, and V is the voltage across the resistor).

Thus, referring to the exemplary waveform 112 of FIG. 1b, power is dissipated by termination load 106 according to: 1) $(V_{OH} - V\text{term})^2 / R$ while a logical high (having a voltage of $V_{OH}$) is being driven by driver 103 onto line 105; and 2) $(V\text{term} - V_{OL})^2 / R$ while a logical low (having a voltage $V_{OL}$) is being driven by driver 103 onto line 105. For applications having a large number of high speed signals, the addition of a termination resistance to each high speed line may dramatically increase power consumption resulting in lower reliability and/or decreased battery life (e.g., for handheld applications).

BRIEF DESCRIPTION OF THE DRAWINGS

The present invention is illustrated by way of example, and not limitation, in the Figures of the accompanying drawings in which:

FIG. 1b shows an exemplary waveform that may be driven onto the communication line of FIG. 1a.

DETAILED DESCRIPTION

Recall from the discussion in the background that the power consumed by a resistive termination load may be a matter of concern as high power consumption may cause reliability problems as well as reduced battery life (for those applications that are battery operated). From the embodiment discussed with respect to FIGS. 1a and 1b, power is consumed by termination load 106 according to: 1) $(V_{OH} - V\text{term})^2 / R$ while a logical high is being driven by driver 103 onto line 105; and 2) $(V\text{term} - V_{OL})^2 / R$ while a logical low is being driven by driver 103 onto line 105.

Note that, in light of the relationships expressed just above, as the voltage span of the waveform 112 increases (i.e., as $V_{OH} - V_{OL}$ increases), the power consumed by termination load 106 increases. To first order, this makes sense as termination loads that receive high voltage signals would be expected to dissipate larger amounts of power. Waveforms having relatively large voltage spans result from simplistically designed drivers.

Commonly, the largest voltage difference that exists within a semiconductor chip is the difference between the positive supply voltage (e.g., +3.3 v, +2.5 v, or +1.8 v according to present semiconductor technologies) and a ground reference (typically 0.0 v) or a negative supply voltage. A suitable example of a simplistically designed driver, is a driver that is designed to develop a waveform having only a pair of levels that reside at either of these two extremes (e.g., the positive supply voltage for the logic high level $V_{OH}$ and the ground reference for the logic low level $V_{OL}$).

In a sense, this exemplary "simple" driver may be viewed as designed to "short" the line 105 to the positive supply voltage for a logic high level and designed to "short" the line 105 to the ground reference for a logic low level. As such, the termination load 106 dissipates a maximum amount of power as $(V_{OH} - V\text{term})^2 / R$ is a maximum when $V_{OH}$ is equal to the supply voltage and $(Vterm-V_{OL})^2/R$ is a maximum when $V_{OL}$ is equal to the ground reference voltage. Regardless, for simplistic prior art drivers as described above (or for other simplistic drivers that differ in operation from that described above), this maximum power is dissipated over all time regardless of the logical information being transported on the line 105.

Figure 2A:
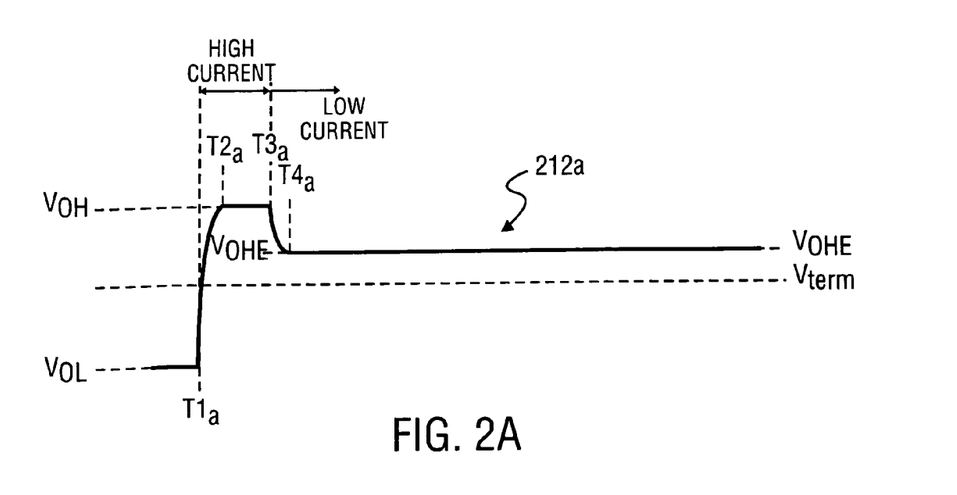
FIG. 2a shows a first power saving waveform.

A more sophisticated driver, however, will generate a more complicated waveform aimed at reducing power dissipation while reliably delivering information. Examples of such waveforms are observed in FIGS. 2a, 2b and 2c. FIG. 2a shows a first waveform 212a that transitions from a logical low level $V_{OL}$ to a logical high level $V_{OH}$ between times T1a and T2a. In an embodiment, $V_{OH}$ corresponds to the positive supply voltage and $V_{OL}$ corresponds to the ground reference. In this case, a maximum voltage difference is observed in transitioning the waveform from a logical high to a logical low.

The large voltage swing from $V_{OL}$ to $V_{OH}$ associated with the logical transition results from the use of a sufficiently large current to overcome the capacitive loading of the signal line 104 (and perhaps the input of the receiver 104). That is, in order to maintain high operational speeds, a sufficiently large current is used to implement a change in the value of the logical information on the signal line 105.

However as a logical value on the signal line 105 can be reliably maintained with less current than the amount of current needed to quickly change a logical value on the signal line 105, according to the design of a more sophisticated driver that generates the waveform 212a of FIG. 2a, less current is used to maintain the logical high voltage level at a later time after the transition is made (such as at time T3a). As such the voltage on the signal line 105 is lowered from the maximum $V_{OH}$ level to a lower logical high level $V_{OHE}$ (which is reached at time T4a as seen in the embodiment of FIG. 2a). Viewing driver 103 of FIG. 1a as a sophisticated driver capable of generating the waveform 212a of FIG. 2a, the reduction of the logical high voltage level from $V_{OH}$ to $V_{OHE}$ has the effect of maintaining a logical high level while reducing power dissipation in the termination load 106.

That is, a logical high level is maintained because, even though the waveform voltage 212a has been lowered, the lowered level of $V_{OHE}$ still remains above that at which high logical levels are recognized by the receiver 104 (e.g., Vterm). Power dissipation is reduced in the termination load 106 (as compared to the prior art approach observed in FIG. 1b) because, as ($V_{OHE}$-Vterm) is less than ($V_{OH}$-Vterm), $(V_{OHE}-Vterm)^2/R$ will be less than $(V_{OH}-Vterm)^2/R$.

Thus, waveform 212a of FIG. 2a may be viewed as carrying the same logical information as waveform 112 of FIG. 1b. However, because of the voltage drop that occurs between times T3a and T4a, waveform 212a of FIG. 2a will cause substantially less power dissipation in the termination load 106 as compared to waveform 112 of FIG. 1b.

In an embodiment, as alluded to just above, in order to develop the more sophisticated waveform 212a shown in FIG. 2a, the driver 103 is designed to modulate its output current Io. For example, between times T2a and T3a, the driver "pushes" an output current of Io=$(V_{OH}-Vterm)/R$ through the termination load 106; and, from time T4a and beyond, the driver 103 pushes a reduced output current of Io=$(V_{OHE}-Vterm)/R$ through the termination load 106.

As such, the driver 103 may be viewed as being designed to drive either of a pair of output currents while it is providing a stable logical high voltage on line 105: a first, larger current of $(V_{OH}-Vterm)/R$ (between times T2a and T3a) and a second, smaller current of $(V_{OHE}-Vterm)/R$ (after time T4a). Other currents may exist during the transitory periods that exist between times T1a and T2a and between times T3a and T4a.

Note that, with respect to FIG. 2a, the logical value begins to change from a logical low to a logical high at time T1a. Typically, shunt capacitance (or series inductance) associated with the line 105 (and, perhaps, the receiver 104 and/or driver 103) effectively "resists" a sudden voltage change on line 105. Slow changes in the line 105 voltage corresponds to slow line signaling and, as such, is usually deemed as being undesirable.

However, the higher the output current Io supplied by the driver 103, the easier it becomes to rapidly change the voltage on line 105. In a sense, stronger currents are able to overcome the detrimental effects of the shunt capacitance (or series inductance). In order to generate a waveform such as (or similar to) the waveform 212a observed in FIG. 2a, "high" driver output current Io is used to implement a change in logical value (so that logical values on the line 105 may be changed rapidly).

For example, the driver 103 may be designed to provide an output current of Io=$(V_{OH}-Vterm)/R$ or higher during a first transitory period that exists between times T1a and T2a in order to rapidly increase the line voltage as observed in FIG. 2a. As the waveform stabilizes (i.e., as the end of the first transitory period at time T2a is approached), the driver's output current approaches (or maintains) a value of Io=$(V_{OH}-Vterm)/R$.

A "high" driver output current of Io=$(V_{OH}-Vterm)/R$ may then be maintained for an extended period of time (e.g., up to time T3a as seen in FIG. 2a). Then, the driver 103 lowers its output current causing a second transitory period from time T3a to time T4a. As the waveform stabilizes (i.e., as the end of the second transitory period at time T4a is approached), the driver's output current approaches (or maintains) a value of Io=$(V_{OHE}-Vterm)/R$.

Thus, the driver 103 may be viewed as designed to employ: 1) "high" output current over a first time period (e.g., from time T1a to time T3a) in order to change the line's logical value; and, 2) "low" output current after the first time period has expired (e.g., after time T3a and beyond) in order to maintain the line's logical level, at a reduced power, after it has been changed.

Using a higher current in order to implement a change in logical value allows the logical value to be changed quickly (which corresponds to high speed signaling) while using a lower current to maintain the logic level corresponds to reduced power dissipation in the termination load 106. Hence, power is conserved without reducing performance.

Figure 2B:
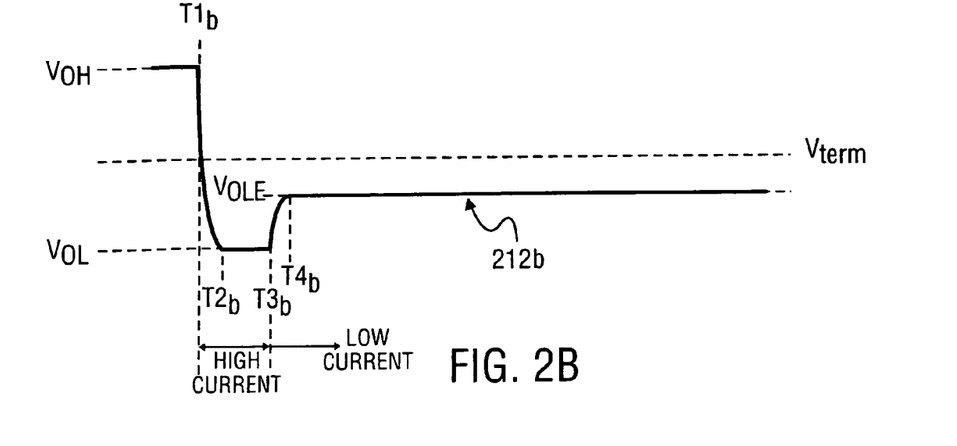
FIG. 2b shows a second power saving waveform.

Note that the exemplary waveform of FIG. 2a shows a change in logical value from a low logical value to a high logical value. FIG. 2b shows a corresponding embodiment of a waveform 212b that transitions from a logical high level $V_{OH}$ to a logical low level $V_{OL}$ between times T1b and T2b. Similar to the waveform 212a of FIG. 2a, at a later time after the transition is made (such as time T3b) the logical low voltage level is raised from the $V_{OL}$ level to a higher logical low level $V_{OLE}$ (which is reached at time T4b as seen in the embodiment of FIG. 2a).

Here, the increase of the logical low voltage level from $V_{OL}$ to $V_{OLE}$ has the effect of maintaining a logical low level while reducing power dissipation in the termination load 106. That is, a logical low level is maintained because, even though the waveform voltage 212b has been raised, the higher level of $V_{OLE}$ still remains below that at which low logical levels are recognized by the receiver 104 (e.g., Vterm). Power dissipation will also be reduced in the termination load 106 (as compared to the prior art approach observed in FIG. 1b) because, as (Vterm-$V_{OLE}$) is less than (Vterm-$V_{OL}$), (Vterm-$V_{OLE}$)$^2$/R will be less than (Vterm-$V_{OL}$)$^2$/R.

In order to generate a waveform such as (or similar to) the waveform 212b observed in FIG. 2b, "high" driver output current Io is used to implement a change in logical value (so that logical value on the line 105 may be changed rapidly). For example, the driver 103 may be designed to "pull" an output current of Io=(Vterm-$V_{OL}$)/R or higher (in a direction that flows into the driver 103) during a first transitory period that exists between times T1b and T2b in order to rapidly decrease the line voltage as observed in FIG. 2b.

As the waveform stabilizes (i.e., as the end of the first transitory period at time T2b is approached), the driver's output current approaches (or maintains) a value of Io=(Vterm-$V_{OL}$)/R. A "high" driver output current of Io=(Vterm-$V_{OL}$)/R may then be maintained for an extended period of time (e.g., up to time T3b as seen in FIG. 2b). Then, the driver 103 lowers its output current causing a second transitory period from time T3b to time T4b. As the waveform stabilizes (i.e., as the end of the second transitory period at time T4b is approached), the driver's output current approaches (or maintains) a value of Io=(Vterm-$V_{OLE}$)/R.

Note that the manner of controlling the time period over which "high" output current is employed (e.g., the amount of time between time T1a and T3a in FIG. 2a or the amount of time between T1b and T3b in FIG. 2b) may vary from embodiment to embodiment. In various embodiments, the driver 103 may be designed to control this time period in an analog fashion (e.g., by triggering the "switchover" from high output current to low output current after the expiration of an RC time constant (or multiple thereof) or other form of propagation delay).

In other embodiments, the driver 103 may be designed to control this time period in a digital fashion (e.g., by triggering the "switchover" from high output current to low output current upon the edge of a clock cycle). An example of a driver that controls this time period in a digital fashion is described in more detail below. Regardless if an analog or digital approach is employed, the length of the "high" current time period should be sufficient to ensure that the logic value will be changed with sufficient rapidity for the particular application.

Figure 2C:
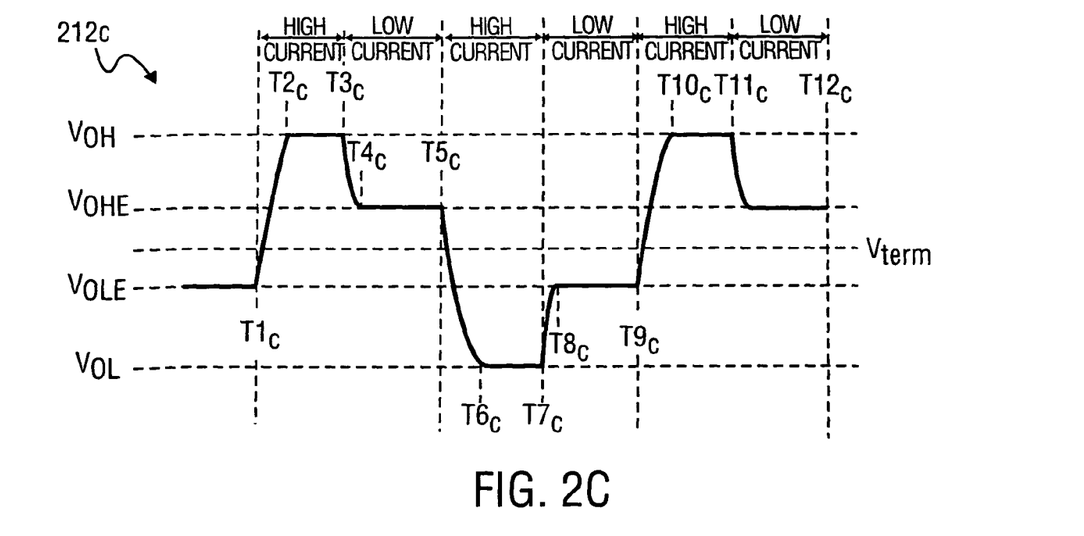
FIG. 2c shows a third power saving waveform.

FIG. 2c shows a sequence of three logical changes (in the form of a "101" bit pattern) where the "high" current time period is designed to be less than the time period of a bit of information. As such, each bit of information is formed with "high" driver current and with a "low" driver current. For example, the first bit (a "1") is formed with: 1) a "high" current time period that extends from T1c to T3c; and 2) a "low" current time period that extends from T3c to T5c. Note, however, that the receiver 104 will recognize the first bit after the waveform 112c rises above Vterm (which occurs just after time T1c) and until the waveform 112c falls below Vterm (which occurs just after time T5c).

The second bit (a "0") is formed with: 1) a "high" current time period that extends from T5c to T7c; and 2) a "low" current time period that extends from T7c to T9c. The third bit (a "1") then begins to be formed with a "high" current time period that starts at time T9c. Note again that the receiver 104 will recognize the second bit after the waveform 112c falls below Vterm (which occurs just after time T5c) and until the waveform 112c rises above Vterm (which occurs just after time T9c).

Figure 3:
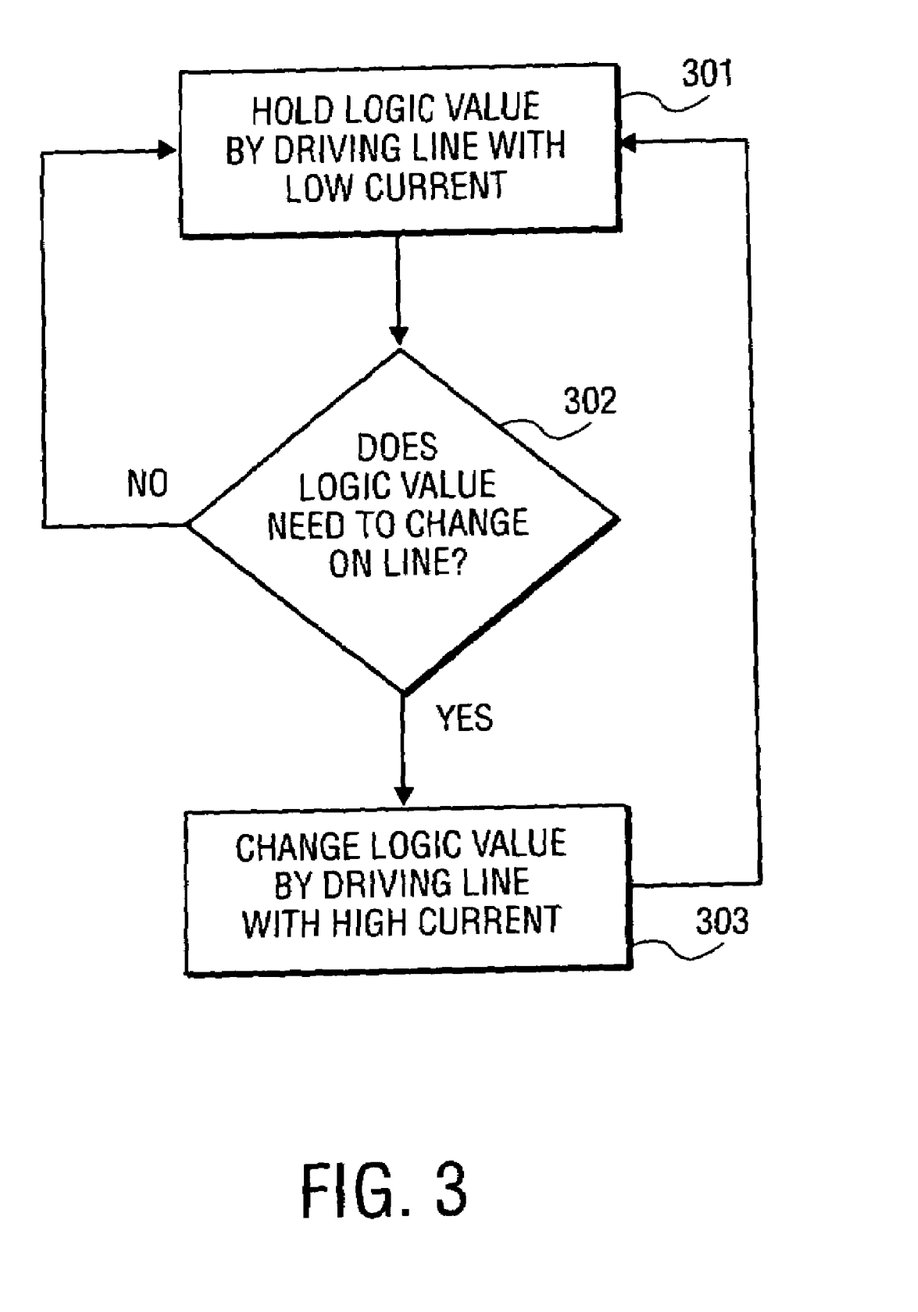
FIG. 3 shows a methodology for generating a power saving waveform.

FIG. 3 shows a methodology that may be used to generate the waveform 112c observed in FIG. 2c. According to the methodology of FIG. 3, a logic level is held by driving 301 a line with low current. This may be viewed, for example, as corresponding to the low current region that extends from T3c to T5c (for the first bit of FIG. 2c) or the low current region that extends from T7c to T9c (for the second bit of FIG. 2c).

If the logic value needs to change 302, the logic value is changed by driving 303 the line with high current. This may be viewed, for example, as corresponding to the high current region that extends from T5c to T7c (for the second bit of FIG. 2c) or the high current region that extends from T9c to T11c (for the third bit of FIG. 2c). Then, subsequently, the logic value is again held by driving 301 the line with low current. This may be viewed, for example, as corresponding to the low current region that extends from T7c to T9c (for the second bit of FIG. 2c) or the low current region that extends from T11c to T12c (for the third bit of FIG. 2c).

Note that, if the logic value does not need to change 302, the logic value remains held by driving 301 the line with a low current. Although this aspect does not appear in the waveform 112c of FIG. 2c it can be easily envisioned. For example, if the second bit were to correspond to a "1" (such that a "111" bit pattern is expressed), a transition from a logic high to a logic low would not begin to occur at time T5c. Instead, the waveform would continue, unchanged, along the $V_{OHE}$ level from time T5c to time T12c. As such, in cases where the same bit value is repeated, the repeated bit value is expressed as a low power signal.

Figure 4A:
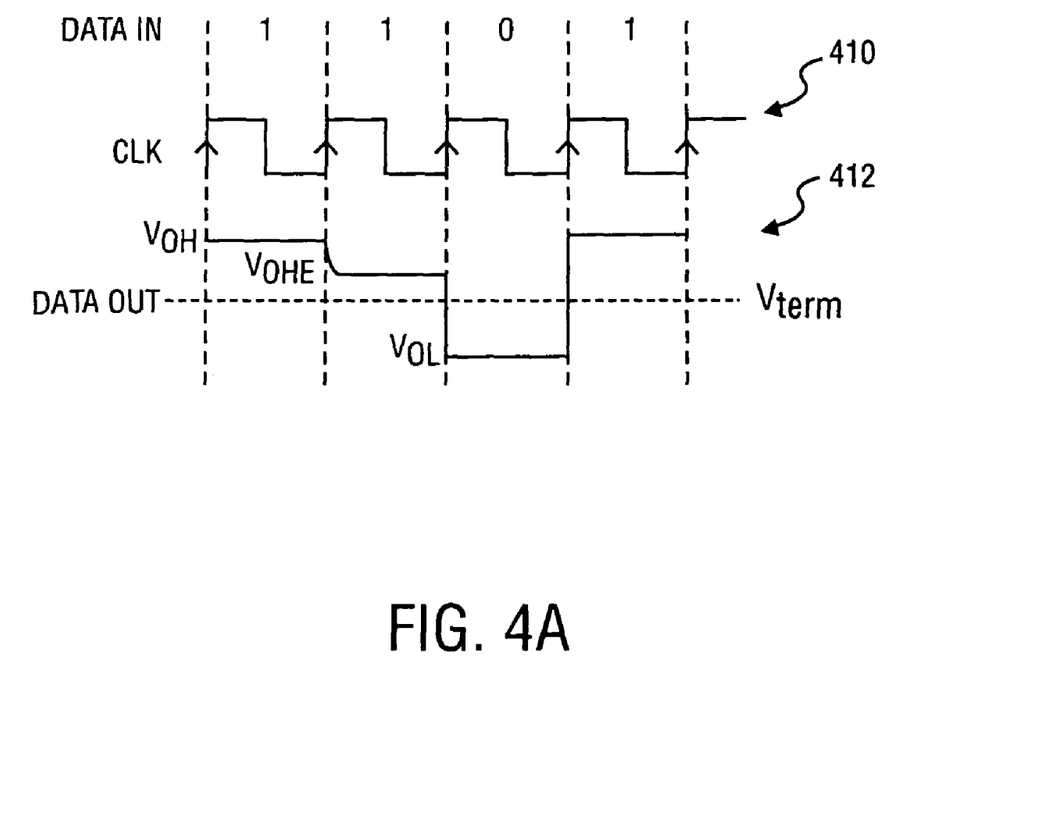
FIG. 4a shows a fourth power saving waveform that can be generated by the driver of FIG. 4b.
Figure 4B:
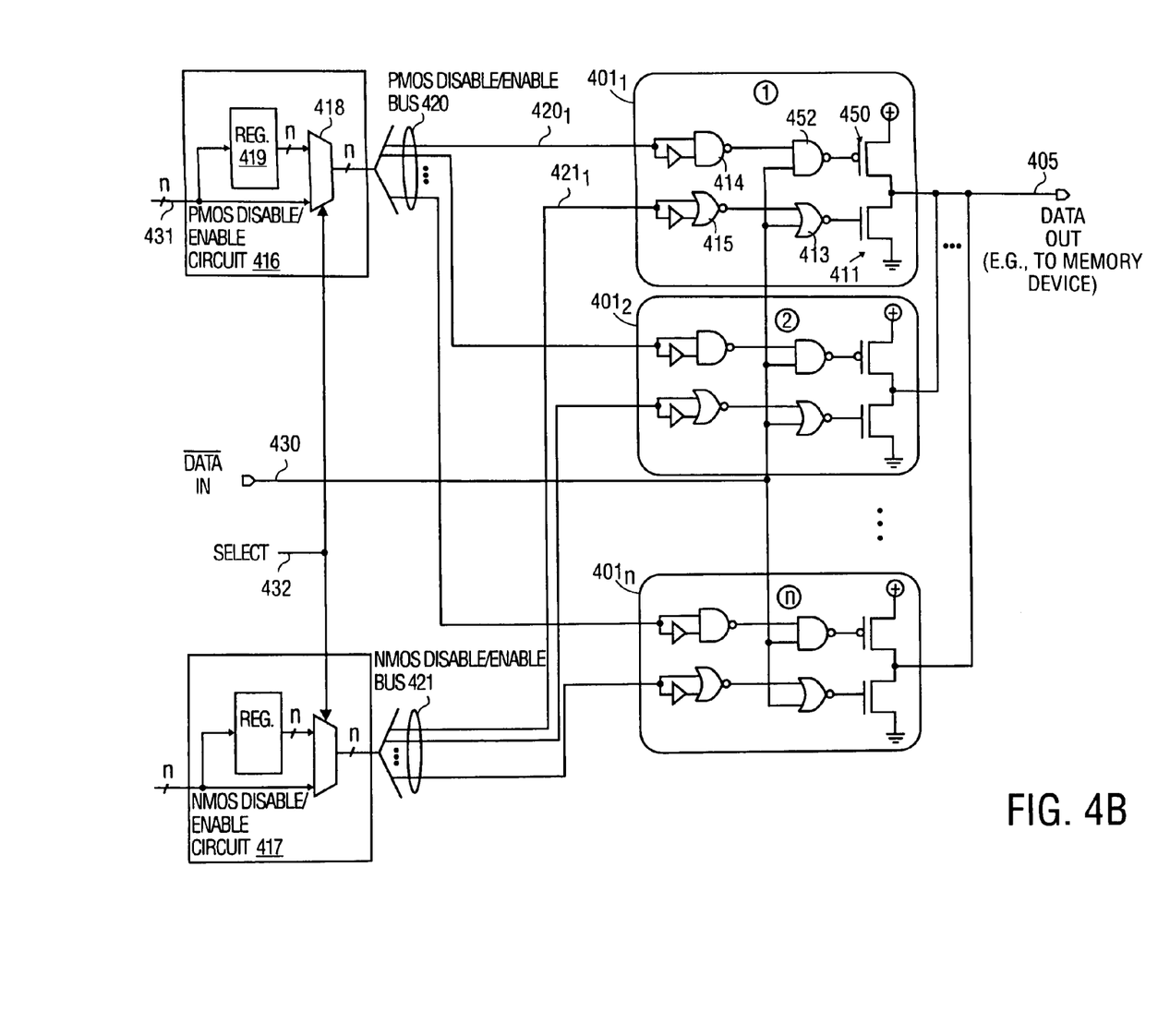
FIG. 4b shows an embodiment of a driver that can implement the methodology of FIG. 3.

FIGS. 4a and 4b relate to another, alternative embodiment. FIG. 4a shows: 1) the data to be driven over the line ("Data In" which corresponds to a "1101" pattern); 2) a clock signal waveform 410 that times the transmission of the 1101 pattern; and 3) the waveform 412 that is driven over the line by a driver ("Data Out"). Referring to the driver output waveform 412 (Data Out) of FIG. 4a, note that a high current time period is coextensive with a bit width.

That is, the first bit maintains a voltage level of $V_{OH}$ throughout its width. Upon the expiration of the first bit (which is observed at the second rising edge of the clock signal 410), the second bit maintains a logical "1" value by being driven with a low current (such that the waveform 412 drops to a lower voltage level of $V_{OHE}$). Upon the expiration of the second bit (which is observed at the third rising edge of the clock signal 410), the third bit is switched to a logical "0" value and, as such, is driven with a high current (such that the waveform 412 drops to a voltage level of $V_{OL}$).

Again, as a high current is used for a complete bit width, the third bit maintains a voltage level of $V_{OL}$ throughout its width. Upon the expiration of the third bit (which is observed at the fourth rising edge of the clock signal 410), the fourth bit is switched to a logical "0" value and, as such, is driven with a high current (such that the waveform 412 rises to a voltage level of $V_{OH}$). Again, as a high current is used for a complete bit width, the fourth bit maintains a voltage level of $V_{OH}$ throughout its width.

Figure 5:
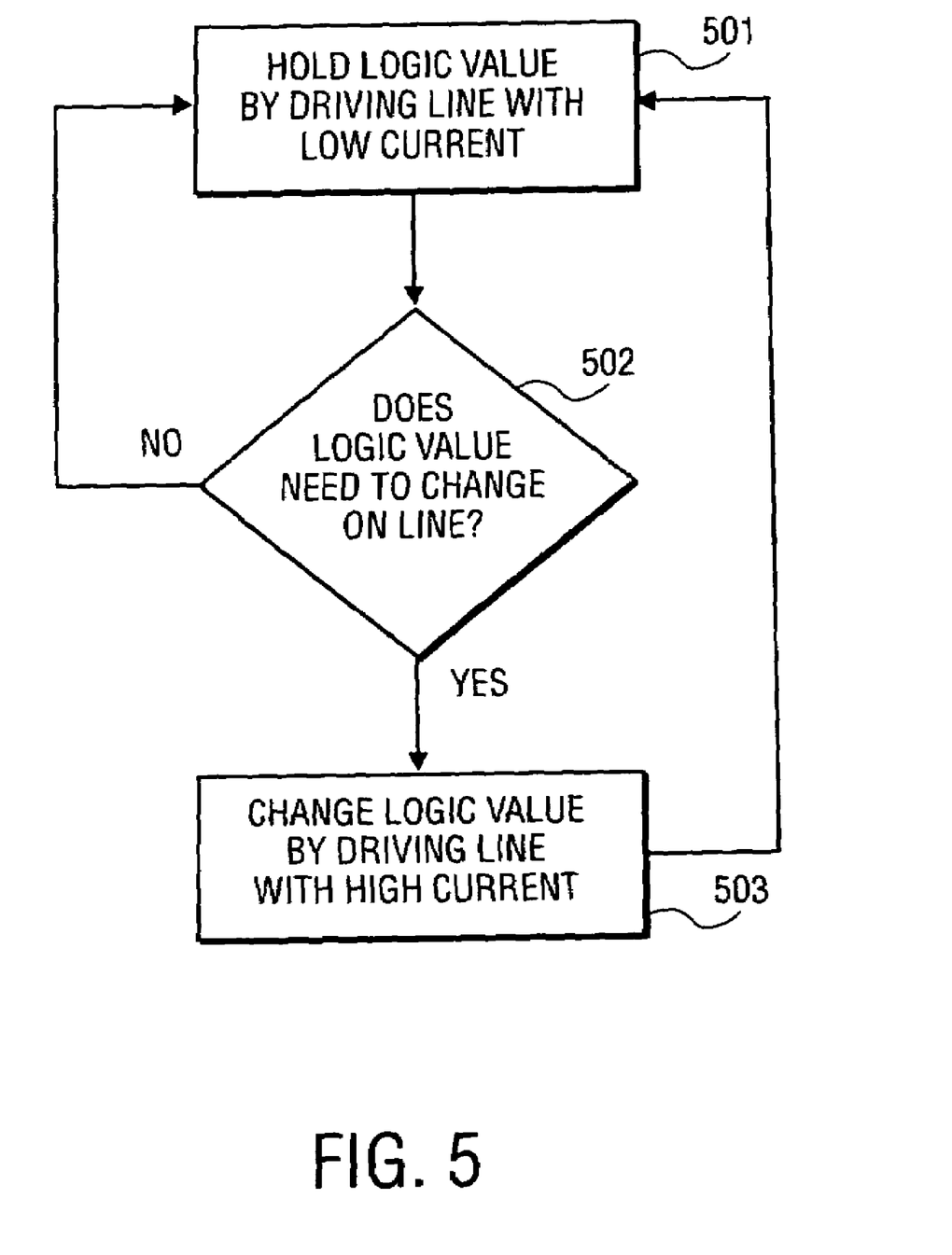
FIG. 5 shows a methodology that conforms to the embodiments of FIGS. 4a and 4b.

The sequence described above corresponds to the methodology outlined in FIG. 5. According to FIG. 5, if a logic value needs to change 502, the logic value is changed by driving 503 the line with a high current. A high current continually drives the line until the next possibility arises to change the logic value on the line (e.g., a clock edge). If the logic value does not need to change 503, the logic value is held by driving 501 the line with a low current; or, alternatively, if the logic value needs to change 503 it is changed by driving 503 the line with a high current.

FIG. 4b shows an embodiment of a driver circuit that may be designed to conform to the methodology of FIGS. 4a and 5. The driver circuit of FIG. 4b includes a parallel arrangement of sub-driver circuits $401_1$ through $401n$. The parallel arrangement of sub-driver circuits $401_1$ through $401_n$ allows the output current driven on output line 405 (which may be viewed as corresponding to the signal line 105 between a driver and receiver) to be increased or decreased quickly and easily.

Specifically, less sub-driver circuits are disabled if a large output current is desired at output 405 and more sub-driver circuits are disabled if a small output current is desired. For example, if a large output current is desired so that an output voltage of $V_{OH}$ is formed at output 405 (such as the period of time over which the first "1" is formed in the 1101 pattern observed in FIG. 4a), a number X of the n sub-driver circuits $401_1$ through $401_n$ are disabled.

Then, if a smaller output current is desired so that an output voltage of $V_{OHE}$ is formed at output 405 (such as the period of time over which the second "1" is formed in the 1101 pattern observed in FIG. 4a), a larger number Y (where Y>X) of the n sub driver circuits $401_1$ through $401_n$ are disabled. Better said, some of the sub-drivers that were enabled in order to form the $V_{OH}$ output voltage are subsequently disabled so that an output voltage of $V_{OHE}$ can be formed.

As seen in the embodiment of FIG. 4b, each driving transistor associated with a sub-driver circuit has its own disable signal. That is, referring to sub-driver circuit 401, as a basis for discussion, the PMOS driving transistor 450 is disabled if the output of NAND gate 414 corresponds to a logic "0" (because the output of NAND gate 452 would remain fixed at a logic "1" which keeps the PMOS driving transistor 450 "off"); and, the NMOS driving transistor 411 is disabled if the output of NOR gate 415 corresponds to a logic "1" (because the output of NOR gate 413 would remain fixed at a logic "0" which would keep the NMOS driving transistor 411 "off").

As such, a sub-driver circuit may be completely disabled (such that it acts as a high impedance circuit element from the perspective of node 405) if both its PMOS driving transistor and its NMOS driving transistor are kept off. As the output of NAND gate 414 can be fixed at a logic "0" if its input signal line $420_1$ is a logic "1"; and as, the output of NOR gate 415 can be fixed at a logic "1" if its input signal line $421_1$ is a logic "0", sub-driver circuit 401, can be disabled by applying a "1" at signal line $420_1$ and a "0" at signal line $421_1$. The rest of the sub-driver circuits $401_2$ through $401_n$ can be similarly disabled.

If a sub-driver circuit is not disabled (e.g., if, for sub-driver circuit $401_1$, a "0" is applied at signal line $420_1$ and a "1" is applied at signal line $421_1$) it behaves as an inverting driver. Because the inverted data input 430 As such, a "0" applied at the inverted data input 430 will produce a "1" at the data output 405; and, a "1" applied at the inverted data input 430 will produce a "0" at the data output 405.

Together, the PMOS and NMOS enable/disable circuits 416 and 417 provide the appropriate enabling/disabling signals for the sub-driver circuits $401_1$ through $401_n$. That is, PMOS enable/disable circuit 416 provides a separate enabling/disabling signal for each of the PMOS transistors within then sub-driver circuits $401_1$ through $401_n$; and, the NMOS enable/disable circuit 417 provides a separate enabling/disabling signal for each of the NMOS transistors within the sub-driver circuits $401_1$ through $401_n$ As such, the PMOS enable/disable circuit 416 may be said to provide a PMOS disable/enable bus 420 and the NMOS disable/enable circuit 417 may be said to provide an NMOS disable/enable bus 421.

The specific number of sub-driver circuits that are disabled at any time depends on the output words provided on the disable/enable buses 420, 421. The words may be envisioned in the embodiment of FIG. 4 as a form of "one hot" encoding where each logical "1" in the disabling/enabling PMOS bus 420 word corresponds to a disabled sub-driver circuit and each logical "0" in the NMOS disabling/enabling bus 421 word corresponds to a disabled sub-driver circuit. Note that in the embodiment of FIG. 4, in order to turn off both the PMOS and NMOS transistors together within the same sub-driver circuit, these words should be the logical inverse of one another (because a disabling NMOS bus 420 signal is a "1" and a disabling PMOS bus 421 signal is a "0").

Because a change in the value of the word presented on the buses 420, 421 corresponds to a change in the number of disabled drivers, the output current can be made to change (e.g., wherein a large output current provided with more enabled sub-driver circuits is reduced to a small output current by changing to less enabled sub-driver circuits) by changing the output word values provided by the disabling/enabling circuits 416 and 420. Using the PMOS disable/enable circuit 416 as a basis of discussion, in an embodiment, multiplexer 418 is configured to receive a "high current" output word (e.g., a word that enables a sufficient number of sub-drivers to form a $V_{OH}$ output voltage) from register 419 and a "low current" output word (e.g., a word that enables a sufficient number of sub-drivers to form a $V_{OHE}$ output voltage) from the PMOS disable/enable circuit 431 input.

As such, referring to FIGS. 4a and 4b as an example, during the first "1" of the 1101 pattern of FIG. 4b the output of register 419 is selected by the multiplexer 418; and, during the second "1" of the 1101 pattern of FIG. 4b the circuit input 431 is selected by the multiplexer 418. The multiplexer can be made to toggle its selection via select line 432. That is, a first state of select line 432 corresponds to a high current output and a second state of select line 432 corresponds to a low current output. The timing of select line 432 can be controlled via the same clocking signals used to time the data being driven onto output 405 so that changes in output current can be triggered along with changes in the data.

The approach of FIGS. 4a and 4b may be used to reduce the power consumption of various interface architectures such as (to name just one of many that are possible) the Double Data Rate Synchronous Dynamic Random Access Memory (DDR-SDRAM) memory interface. Presently DDR uses SSTL-2 termination which corresponds to the line termination described above. Furthermore, the address lines and control signal line should only change once over the course of a burst read or write that consumes multiple clock cycles.

Figure 6:
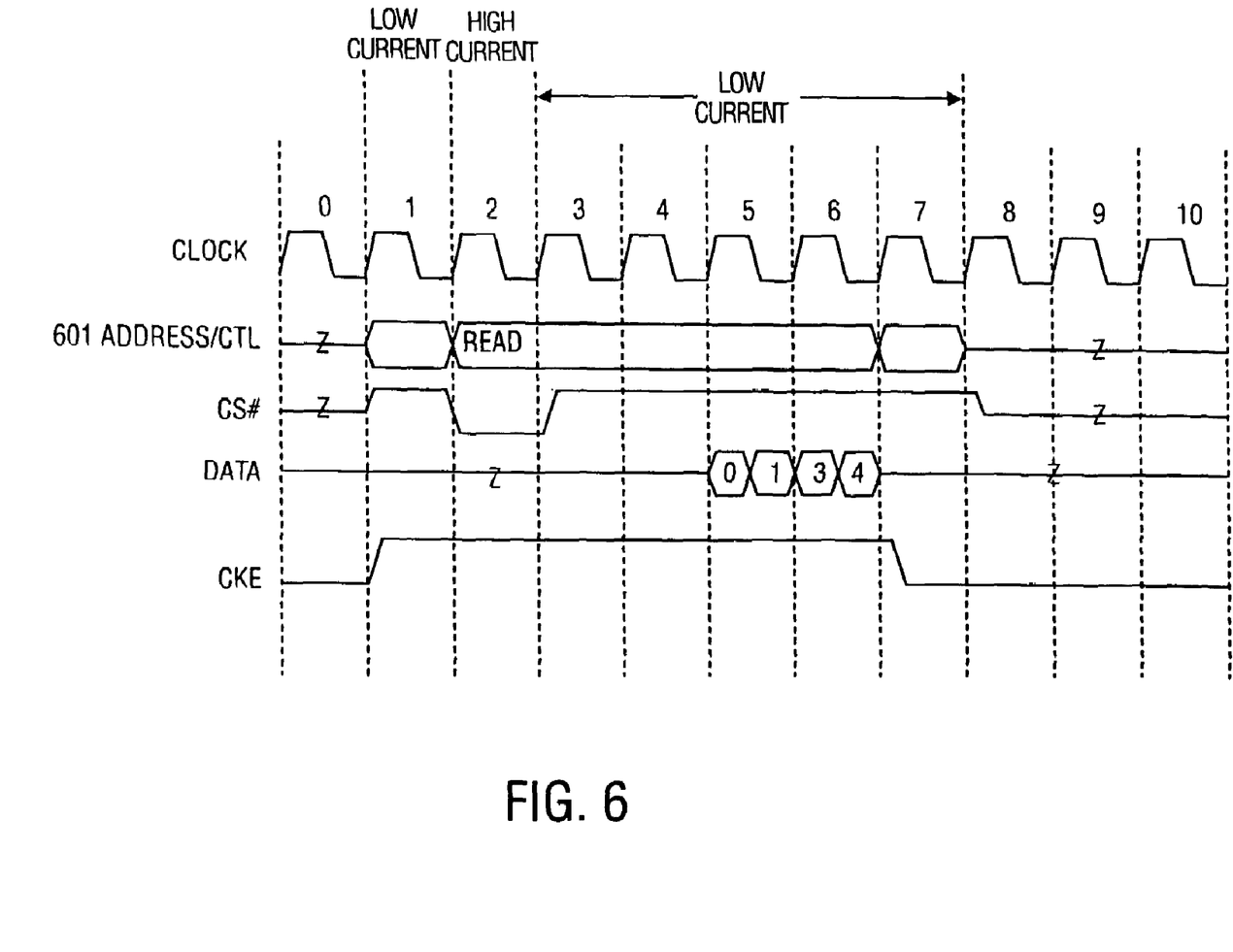
FIG. 6 shows a multiple clock cycle burst read for a DDR interface.

For example, FIG. 6 shows an embodiment of a single read with a burst length of four for a DDR memory interface. In this example, the driver's signaling corresponds to the address or control lines that are received by a memory device. For simplicity, the signaling for the address lines and control lines are drawn lumped together (as is common practice) with waveform "Address/Ctl" 601. Note that the waveform 601 is "active" (i.e., enabled) for the seven clock cycles that extend from Clock Cycle 1 to Clock Cycle 7 and is "inactive" (i.e., disabled) for Clock Cycle 0 and Clock Cycles 8 through 10.

As seen in FIG. 6, of the seven clocks cycles that the waveform 601 is active, a logical change is only possible between Clock Cycles 1 and 2. That is, the address lines and control line of the interface can only change their logical value between the first and second clock cycles. As such, if the driving approach of FIG. 5 is employed, a high current will only be observed during Clock Cycle 2. Clock Cycle 1 and Clock Cycles 3 through 7 will be implemented with low current for the address lines and control lines which will dramatically reduce the power consumption of the interface (as compared to prior art solutions which use high current across Clock Cycles 1 through 7). In a related embodiment, It is important to point out that the Vterm, $V_{OH}$, $V_{OHE}$, $V_{OL}$ and $V_{OLE}$ voltage levels (as well as the high and low currents and the termination resistance) may vary from embodiment to embodiment as those of ordinary skill will be able to determine appropriate values for their particular application. Specifically, as just one possible alternate approach, the $V_{OH}$ and $V_{OL}$ voltage levels may be different than the power and ground voltage supply rails (e.g., such as $V_{OH}$ being at a voltage level that is less than a positive supply voltage and $V_{OL}$ being at a voltage level that is greater than the ground supply voltage).

Note also that embodiments of the present description may be implemented not only within a semiconductor chip but also within machine readable media. For example, the designs discussed above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine readable media also include media having layout information such as a GDS-II file. Furthermore, netlist files or other machine readable media for semiconductor chip design may be used in a simulation environment to perform the methods of the teachings described above.

Thus, it is also to be understood that embodiments of this invention may be used as or to support a software program executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:
   a) driving a first current through a line and a termination resistance so that a logical value on said line changes from a first logical value to a second logical value, said first current sustained for a width of a first bit that is propagated on said line; and,
   b) holding said second logical value on said line by driving a second current through said line and said termination resistance, said second current less than said first current, said second current sustained for a width of a second bit that is propagated on said line.

2. The method of claim 1 wherein said first and second currents flow in a direction from said line into said termination resistance.

3. The method of claim 2 wherein said second logical value is a logical high.

4. The method of claim 2 wherein said first current produces a first voltage on said line that is larger than a second voltage produced on said line by said second current.

5. The method of claim 1 wherein said first and second currents flow in a direction from said termination resistance into said line.

6. The method of claim 5 wherein said second logical value is a logical low.

7. The method of claim 5 wherein said first current produces a first voltage on said line that is smaller than a second voltage produced on said line by said second current.

8. The method of claim 1 wherein said first bit width is coextensive with a clock cycle.

9. The method of claim 1 wherein said driving a first current further comprises applying a first multiplexer select line state to a multiplexer so that a first word is provided at an output of said multiplexer, said first word enabling a first number of sub-drivers, and said driving a second current further comprises applying a second multiplexer select line state to said multiplexer so that a second word is provided at said output of said multiplexer, said second word enabling a second number of said sub-drivers, said first number greater than said second number.

10. An apparatus to drive a logic level with multiple current strengths, comprising:
   a plurality of drivers each having a enable/disable input, each said enable/disable input coupled to an output of a multiplxer, said mutliplexer having a first group of inputs and a second group of inputs, said first group of multiplexer inputs to provide an indication of a first number of said drivers to be enabled while driving a logic level with a first current strength, said second group of multiplexer inputs to provide an indication of a second number of said drivers to be enabled while driving a logic level with a second current strength.

11. The apparatus of claim 10 wherein said first number is greater than said second number and said first current strength is greater than said second current strength.

12. The apparatus of claim 10 wherein said group of multiplexer inputs are coupled to a group of register outputs.

13. The apparatus of claim 10 wherein said multiplexer's channel select input is coupled to a signal line, said signal line to carry a signal that indicates when said logic level is to be driven with said first current strength and when said logic level is to be driven with said second current strength.

14. The apparatus of claim 11 wherein each driver of said plurality of drivers also has a second enable/disable input, each of said enable/disable inputs to enable/disable a P channel transistor within its respective driver, said P channel transistor to push current over a line, each of said second enable/disable inputs to enable/disable an N channel transistor within its respective driver, said N channel transistor to pull current from said line, said second enable/disable inputs coupled to an output of a second multiplexer.

15. The apparatus of claim 14 wherein said second mutliplexer has a first group of inputs and a second group of inputs, said first group of multiplexer inputs to provide an indication of a first number of said drivers to have an enabled P channel transistor while driving said logic level with a first current strength, said second group of multiplexer inputs to provide an indication of a second number of said drivers to have an enabled P channel transistor while driving a logic level with a second current strength, said first group of second multiplexer inputs to provide an indication of a first number of said drivers to have an enabled N channel transistor while driving said logic level with a first current strength, said second group of second multiplexer inputs to provide an indication of a second number of said drivers to have an enabled N channel transistor while driving a logic level with a second current strength.

16. The apparatus of claim 15 wherein said first group of first multiplexer inputs are coupled to a first group of first register outputs and said first group of second multiplexer inputs are coupled to a second group of register outputs.

17. The apparatus of claim 15 wherein a first channel select input of said first multiplexer and a second channel select input of said second multiplexer are both coupled to a signal line, said signal line to carry a signal that indicates when said logic level is to be driven with said first current strength and when said logic level is to be driven with said second current strength.

18. An apparatus, comprising:
a DDR memory comprising address lines that are coupled to a plurality of drivers, each of said drivers having an enable/disable input, each said enable/disable input coupled to an output of a multiplexer, said mutliplexer having a first group of inputs and a second group of inputs, said first group of multiplexer inputs to provide an indication of a first number of said drivers to be enabled while driving a logic level with a first current strength, said second group of multiplexer inputs to provide an indication of a second number of said drivers to be enabled while driving a logic level with a second current strength.

19. The apparatus of claim 18 wherein said first number is greater than said second number and said first current strength is greater than said second current strength.

20. The apparatus of claim 18 wherein said first group of multiplexer inputs are coupled to a group of register outputs.

21. The apparatus of claim 18 wherein said multiplexer's channel select input is coupled to a signal line, said signal line to carry a signal that indicates when said logic level is to be driven with said first current strength and when said logic level is to be driven with said second current strength.

22. The apparatus of claim 19 wherein each driver of said plurality of drivers also has a second enable/disable input, each of said enable/disable inputs to enable/disable a P channel transistor within its respective driver, said P channel transistor to push current over a line, each of said second enable/disable inputs to enable/disable an N channel transistor within its respective driver, said N channel transistor to pull current from said line, said second enable/disable inputs coupled to an output of a second multiplexer.

23. The apparatus of claim 22 wherein said second mutliplexer has a first group of inputs and a second group of inputs, said first group of multiplexer inputs to provide an indication of a first number of said drivers to have an enabled P channel transistor while driving said logic level with a first current strength, said second group of multiplexer inputs to provide an indication of a second number of said drivers to have an enabled P channel transistor while driving a logic level with a second current strength, said first group of second multiplexer inputs to provide an indication of a first number of said drivers to have an enabled N channel transistor while driving said logic level with a first current strength, said second group of second multiplexer inputs to provide an indication of a second number of said drivers to have an enabled N channel transistor while driving a logic level with a second current strength.

24. The apparatus of claim 23 wherein said first group of first multiplexer inputs are coupled to a first group of first register outputs and said first group of second multiplexer inputs are coupled to a second group of register outputs.

25. The apparatus of claim 23 wherein a first channel select input of said first multiplexer and a second channel select input of said second multiplexer are both coupled to a signal line, said signal line to carry a signal that indicates when said logic level is to be driven with said first current strength and when said logic level is to be driven with said second current strength.

* * * * *